(12) United States Patent
Hiller et al.

(10) Patent No.: US 6,914,343 B2
(45) Date of Patent: Jul. 5, 2005

(54) THERMOELECTRIC POWER FROM ENVIRONMENTAL TEMPERATURE CYCLES

(75) Inventors: Nathan D. Hiller, San Diego, CA (US); John C. Bass, La Jolla, CA (US); Daniel T. Allen, La Jolla, CA (US)

(73) Assignee: Hi-Z Technology, Inc., San Diego, CA (US)

( * ) Notice: Subject to any disclaimer, the term of this patent is extended or adjusted under 35 U.S.C. 154(b) by 9 days.

(21) Appl. No.: 10/734,336

(22) Filed: Dec. 12, 2003

(65) Prior Publication Data

US 2004/0238022 A1 Dec. 2, 2004

Related U.S. Application Data

(63) Continuation-in-part of application No. 10/021,097, filed on Dec. 12, 2001, now Pat. No. 6,828,579.
(60) Provisional application No. 60/460,057, filed on Apr. 3, 2003.

(51) Int. Cl.$^7$ ............................................... H01L 35/28
(52) U.S. Cl. .............................. 290/43; 290/54; 322/29; 163/205; 163/208; 163/212; 163/210; 163/209; 340/870.16; 340/870
(58) Field of Search ..................... 290/43, 54; 136/205, 136/208, 212, 210, 209; 340/870, 870.16; 322/2 R (56) References Cited

U.S. PATENT DOCUMENTS 4,734,139 A * 3/1988 Shakun ....................... 136/210
5,156,004 A * 10/1992 Wu ............................. 257/718
6,747,572 B2 * 6/2004 Bocko et al. ........... 340/870.16
6,787,691 B2 * 9/2004 Fleurial et al. ............. 136/203
6,791,183 B2 * 9/2004 Kanelis ......................... 62/3.1

* cited by examiner

Primary Examiner—Darren Schuberg
Assistant Examiner—Iraj A. Mohandes
(74) Attorney, Agent, or Firm—John R. Ross; John R. Ross, III (57) ABSTRACT

An electric generator system for producing electric power from the environmental temperature changes such as occur during a normal summer day on Earth or Mars. In a preferred embodiment a phase-change mass is provided which partially or completely freezes during the relatively cold part of a cycle and partially or completely melts during the relatively hot part of the cycle. A thermoelectric module is positioned between the phase-change mass and the environment. The temperature of the phase-change mass remains relatively constant throughout the cycle. During the hot part of the cycle heat flows from the environment through the thermoelectric module into the phase change mass generating electric power which is stored in an electric power storage device such as a capacitor or battery. During the cold part of the cycle heat flows from the phase change mass back through the module and out to the environment also generating electric power that also is similarly stored. An electric circuit is provided with appropriate diodes to switch the direction of the current between the hot and cold parts of the cycle. A preferred phase change mass is a solution of water and ammonia that has freeze points between about 270 K to about 145 K depending on the water ammonia ratio. Preferably, a finned unit is provided to efficiently transfer heat from a module surface to the environment.

24 Claims, 10 Drawing Sheets

THERMOELECTRIC POWER FROM ENVIRONMENTAL TEMPERATURE CYCLES

This application is a continuation in part of Ser. No. 10/021,097 filed Dec. 12, 2001 now U.S. Pat. No. 6,828,579 which is incorporated herein by reference and also claims the benefit of Provisional Application Ser. No. 60/460,057 filed Apr. 3, 2003. The present invention relates to thermoelectric devices and in particular techniques for producing electric power from existing heat sources and to very thin lattice thermoelectric devices.

This invention was made in the course of or under Contract Number N00178-03-C-3018 with the U.S. Naval Surface Warfare Center and the U.S. Government has rights under any patent resulting from this application.

BACKGROUND OF THE INVENTION

A well-known use for thermoelectric devices is for the extraction of electric power from waste heat. For example, U.S. Pat. No. 6,527,548 discloses a self powered space heater for a truck in which heat energy for the heater is used to power electric components of the heater plus charge a battery. In U.S. Pat. No. 6,053,163 heat from a stovepipe is used to generate electricity. U.S. Pat. No. 6,019,098 discloses a self-powered furnace. Various types of thermoelectric modules are available. A very reliable thermoelectric module with a gap-less egg-crate design is described in U.S. Pat. Nos. 5,875,098 and 5,856,210. U.S. Pat. No. 6,207,887 discloses a miniature milli-watt thermoelectric module useful in space applications (and special applications on earth) in combination with radioactive heat source. Quantum well very thin layer thermoelectric modules are known. Some are described in U.S. Pat. Nos. 6,096,965, 6,096,964, 5,436,467 and 5,550,387. U.S. Pat. No. 6,624,349 describes an electric generator using a thermoelectric module to generate electric power from the heat of fusion produced by the freezing of a phase change material. All of these patents are assigned to Applicant's employer and they are all incorporated herein by reference.

Figure 1:
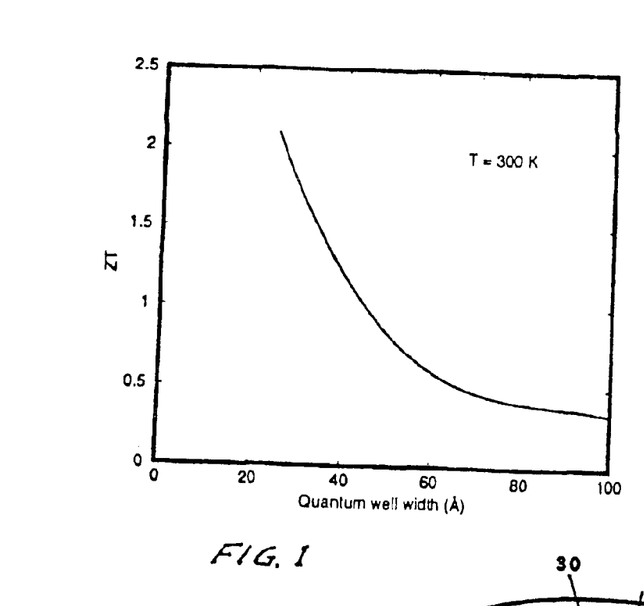
FIG. 1 is a graph showing theoretical values of ZT as a function of quantum well width.

Workers in the thermoelectric industry have been attempting too improve performance of thermoelectric devices for the past 20–30 years with not much success. Most of the effort has been directed to reducing the lattice thermal conductivity (K) without adversely affecting the electrical conductivity. Experiments with superlattice quantum well materials have been underway for several years. These materials were discussed in an paper by Gottfried H. Dohler which was published in the November 1983 issue of Scientific American. This article presents an excellent discussion of the theory of enhanced electric conduction in superlattices. These superlattices contain alternating conducting and barrier layers and create quantum wells that improve electrical conductivity. These superlattice quantum well materials are crystals grown by depositing semiconductors in layers each layer with a thickness in the range of a few to up to about 100 angstroms. Thus, each layer is only a few atoms thick. (These quantum well materials are also discussed in articles by Hicks, et al and Harman published in Proceedings of 1992 1st National Thermoelectric Cooler Conference Center for Night Vision & Electro Optics, U.S.Army, Fort Belvoir, Va. The articles project theoretically very high ZT values as the layers are made progressively thinner.) The idea being that these materials might provide very great increases in electric conductivity without adversely affecting Seebeck coefficient or the thermal conductivity. Harmon of Lincoln Labs, operated by MIT has claimed to have produced a superlattice of layers of (Bi,Sb) and Pb(Te,Se). He claims that his preliminary measurements suggest ZTs of 3 to 4. FIG. 1 shows theoretical calculated values (Sun et al—1998) of ZT plotted as a function of quantum well width.

Figure 1A:
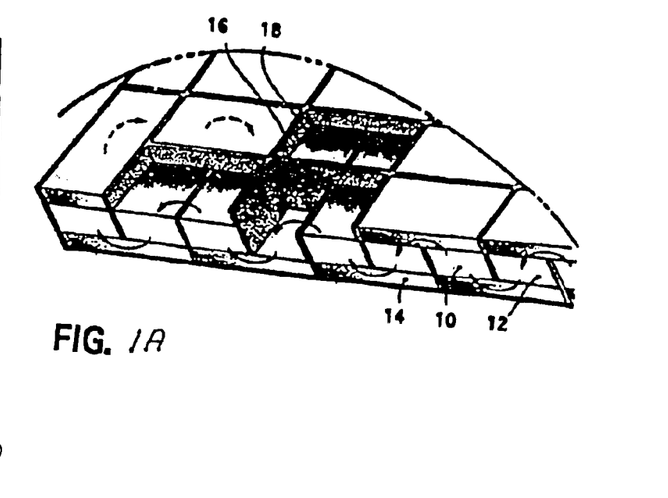
FIGS. 1A and 1B show features of prior art thermoelectric modules.
Figure 1B:
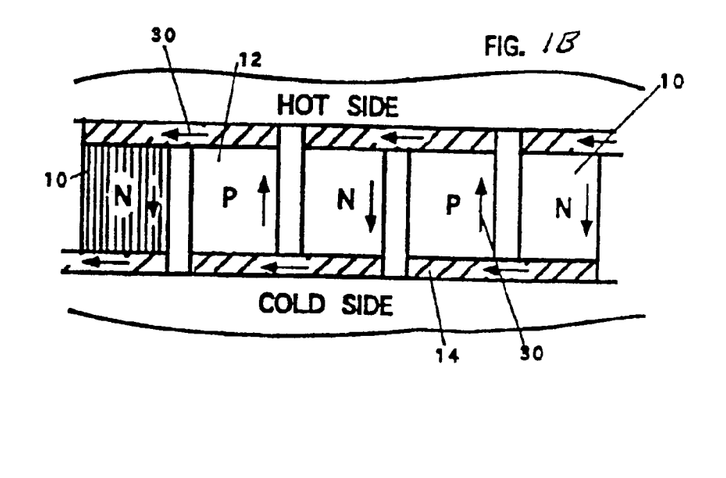

Most of the efforts to date with superlattices have involved alloys that are known to be good thermoelectric materials for cooling, many of which are difficult to manufacture as superlattices. FIGS. 1A and 1B herein were FIGS. 3 and 5 of the "467 patent referred to above. A large number of very thin layers (in the '467 patent, about 250,000 layers) together produce a thermoelectric leg 10 about 0.254 cm thick. In the embodiment shown in the figures all the legs are connected electrically in series and otherwise are insulated from each other in an egg-crate type thermoelectric element as shown in FIG. 1A. As shown in FIG. 1B current flows from the cold side to the hot side through P legs and from the hot side to the cold side through N legs. (Electrons flow in the opposite direction.) These patents disclose superlattice layers comprised of: (1) SiGe as conducting layer and Si as a barrier layer and (2) alternating layers of two different alloys of boron carbide. In the '387 patent Applicants disclose that they had discovered that strain in the layers can have very beneficial effects on thermoelectric properties of the elements disclosed in the '467 patent.

Electric power sources are needed for planetary exploration. Solar cells and Radioisotope Thermoelectric Generators (RTG) are the only two practical options available in the prior art for solid-state long-term power sources for Mars exploration. Both technologies have advantages, however their disadvantages increase mission cost and decrease mission reliability. RTG's are very reliable but have a high cost due to radioactive fuel production, encapsulation, and qualification. There is also a cost associated with launch approval in accordance with the National Environmental Policy Act. Solar cells have a much easier launch approval process, but they are not as reliable as RTGs. If a solar cell array is improperly deployed or deployed facing the wrong direction on Mars then the mission could be hampered or fail. Martian sandstorms can reduce the power of solar cells by the settling of dust on the array, and the wear of the cover glass as a result of abrasive sandstorms. It is evident that a low-cost, reliable power system is needed for Mars exploration.

During the Viking Mission to Mars in 1976, two landers named Viking Lander 1 and Viking Lander 2 collected Martian weather data at 1.6 meters above the Martian surface. This data showed a wide variation in daily atmospheric temperatures on. For example, the daily temperature variations was about 5° C. at Viking Lander 2 in the winter and the daily temperature variation was about 60° C. at Viking Lander 1 in the summer.

What is needed is a better technique for producing small amounts of electric power in very isolated locations such as a remote planet.

SUMMARY OF THE INVENTION

The present invention provides an electric generator system for producing electric power from the environmental temperature changes such as occur during a normal summer day on Earth or Mars. In a preferred embodiment a phase-change mass is provided which partially or completely freezes during the relatively cold part of a cycle and partially or completely melts during the relatively hot part of the cycle. A thermoelectric module is positioned between the phase-change mass and the environment. The temperature of the phase-change mass remains relatively constant throughout the cycle. During the hot part of the cycle heat flows from the environment through the thermoelectric module into the phase change mass generating electric power which is stored in an electric power storage device such as a capacitor or battery. During the cold part of the cycle heat flows from the phase change mass back through the module and out to the environment also generating electric power that also is similarly stored. An electric circuit is provided with appropriate diodes to switch the direction of the current between the hot and cold parts of the cycle. A preferred phase change mass is a solution of water and ammonia that has freeze points between about 270 K to about 145 K depending on the water ammonia ratio. Preferably, a finned unit is provided to efficiently transfer heat from a module surface to the environment.

Many available thermoelectric modules could be used. Preferred modules for remote applications are those with good performance parameters and high reliability. Various types of modules are suggested. For highest module efficiencies quantum well modules are preferred with p-legs and n-legs, each leg being comprised of a large number of at least two different very thin alternating layers of elements. For applications where the temperature range is relatively low, such a Mars application, a preferred quantum well choice is n-doped Si/SiGe for the n-legs and p-doped Si/SiGe for the p-legs. At higher temperatures the preferred quantum well legs are alternating layers of silicon and silicon carbide for the n-legs and for the p-legs alternating layers of different stoichiometric forms of B-C.

DETAILED DESCRIPTION OF PREFERRED EMBODIMENT

Electric Power from Cycling Temperature

Figure 6A:
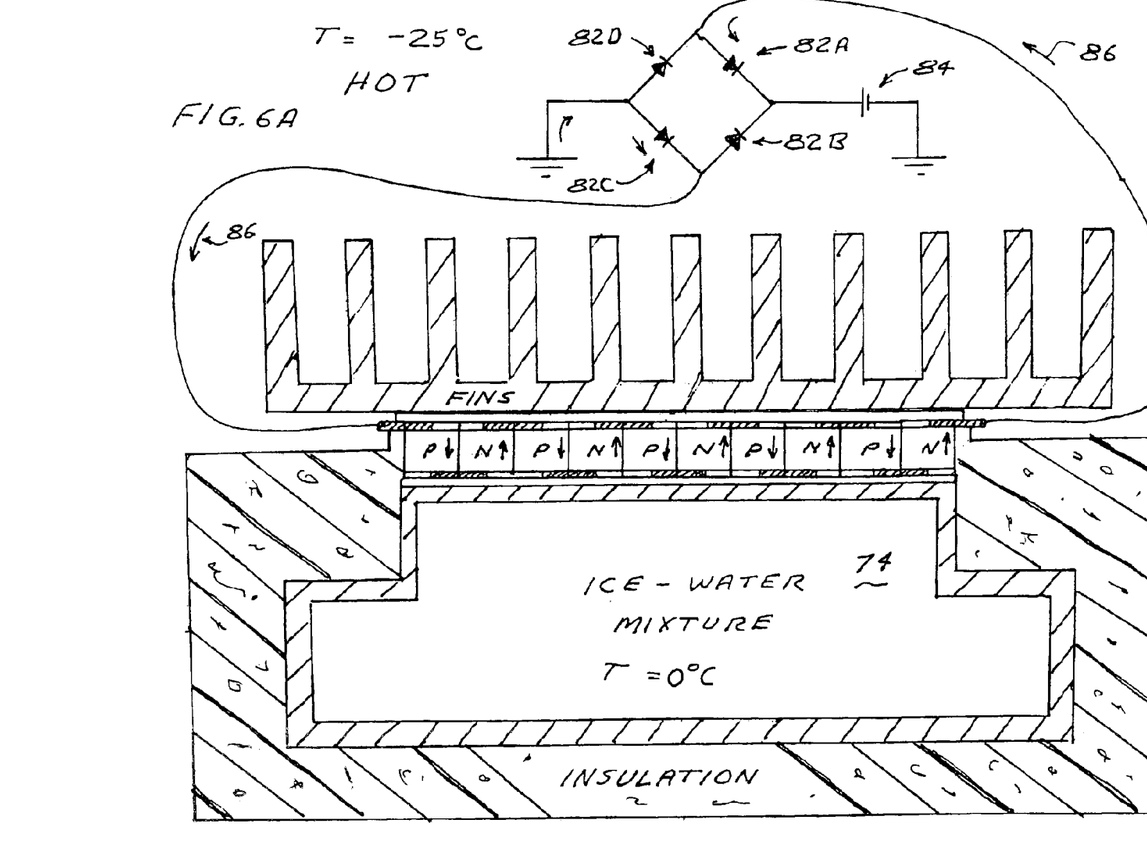
FIGS. 6A and 6B show the operation of a preferred embodiment of the present invention.
Figure 6B:
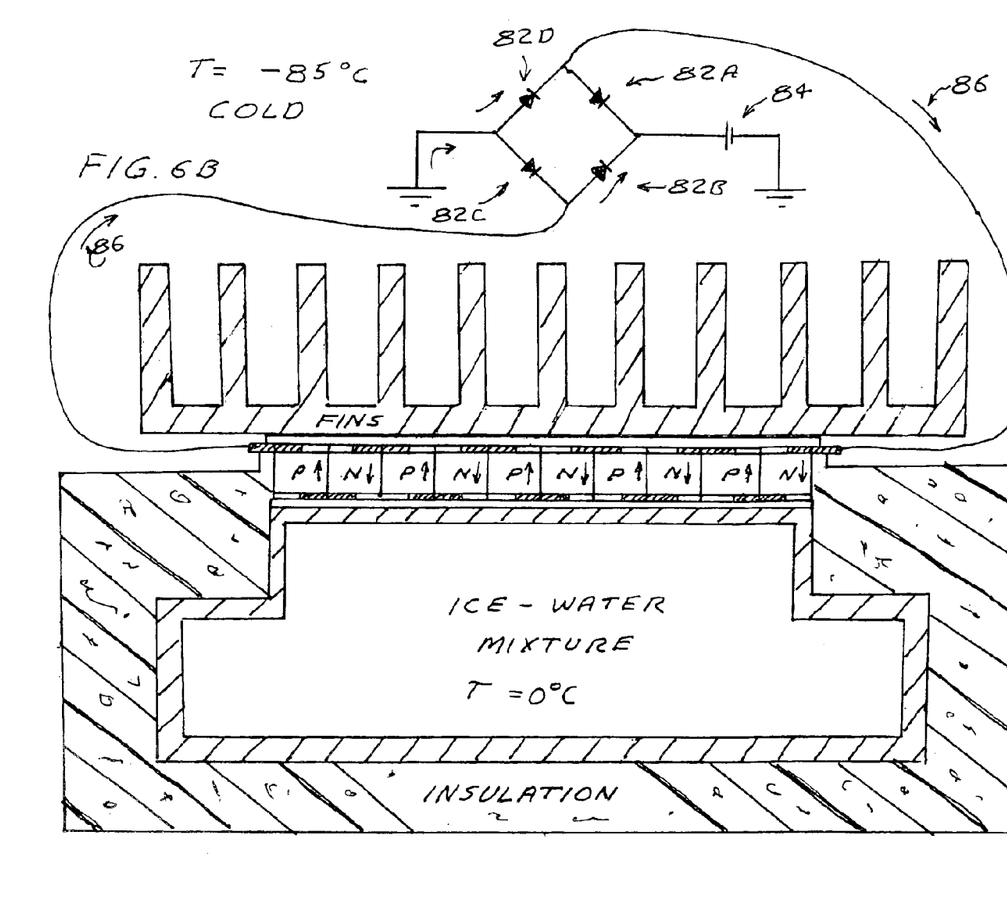

FIGS. 6A and 6B show the basic features of preferred embodiments of the present invention. In this example, based on a Mars application, we are assuming that the temperature of an environment varies between about minus 25 degrees centigrade as shown at 68A in FIG. 6A to about minus 85 degrees centigrade as shown in FIG. 6B from mid-day to mid-night during a period of about 12 hours. A container 70 insulated with thermal insulation 72 contains an ice-water mixture 74. A thermoelectric module 76 comprising n-legs N and p-legs P is sandwiched between a portion of a surface of container 70 and finned element 78. Electrically insulating film 80 separates the module from container 70 and finned element 78. Diode bridge structure comprising diodes 82A, B, C and D permit the charging of capacitor 84 both during periods of cold environmental condition and during periods of hot environmental condition. The temperature of ice-water mixture 74 remains at about minus 55 degrees centigrade at all times while the fin temperature changes with the environmental temperature swinging from minus 30 degrees to plus 30 degrees. The resulting temperature differences across the module cause electric potential differences across the p-legs and the n-legs of module 76. These potential differences produce current flow from hot to cold in the p-legs and from cold to hot in the n-legs. The direction of current flow is shown by arrows 86 in FIGS. 6A and 6B. Current flow through module 76 in the FIG. 6B example is opposite is opposite the current flow through module 76 in the FIG. 6A example; however, in both cases capacitor 84 is charged with electrical energy produced by the module as shown by the current flow arrows 86.

First Preferred Embodiment

A first preferred embodiment of the present invention is an energy-harvesting device that produces electrical power without fuel or sunlight. The device uses daily temperature variations of the Martian atmosphere to convert heat into electrical power using thermoelectric technology. The device is innovative because it does not require fuel or sunlight for operation. Unlike solar cells, the energy-harvesting device will not be vulnerable to Martian dust storms and high impact landings. Replacing nuclear generators with the energy-harvesting generator will reduce mission costs and increase safety of human missions because of the absence of nuclear fuel.

Figure 8:
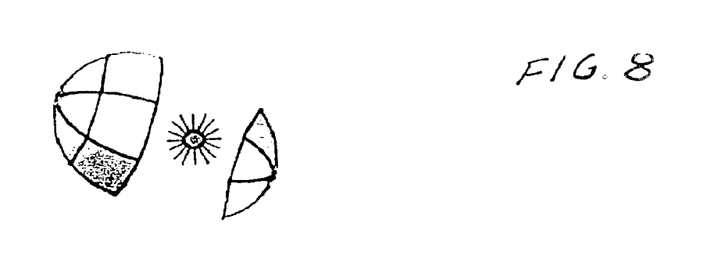
FIG. 8 shows a preferred technique of landing a preferred embodiment on Mars.
Figure 9:
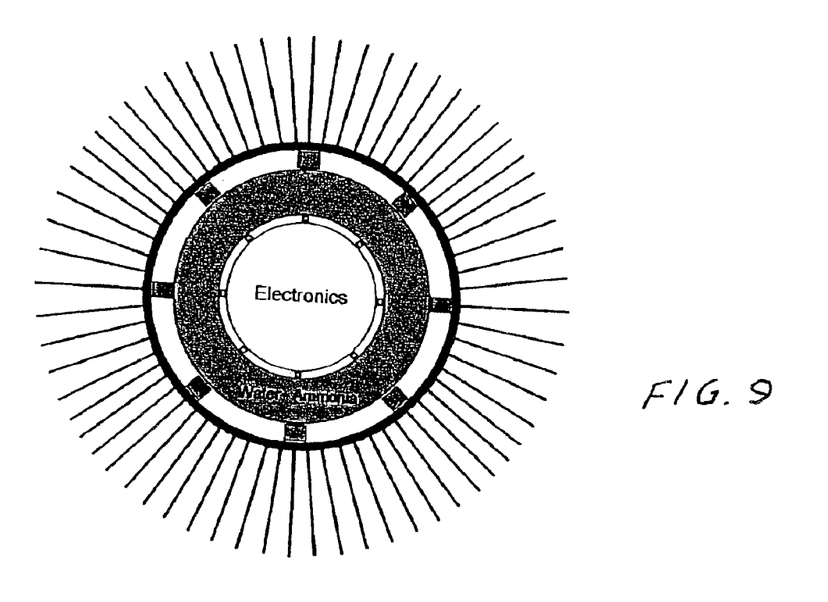
FIG. 9 shows a preferred embodiment of the present invention.

As shown in FIG. 9 this embodiment of the present invention utilizes a sphere for the basic shape of the generator because a sphere has the lowest surface area to volume ratio, thus it has minimal heat loss to volume ratio. A 1-foot diameter sphere for the generator is a reasonable dimension with a total weight of 3 pounds. The 3-pound estimate is the sum of 2.2 pounds of water-Ammonia solution (required for day and night melting and freezing on Mars) and the remaining 0.8 pounds is required for fins, spherical shell, modules, and electronics. A good candidate for the structure and fin material is graphite fiber because it is light and strong with a high thermal conductivity. Because the voltage polarity of the module is dependent on the direction of heat flow through the module, a custom circuit such as the one shown in FIGS. 6A and 6B is needed to maintain a constant voltage polarity with minimal reduction in electrical power. Such a diode rectifier bridge made of silicon diodes can be used to maintain this constant polarity similar to the one shown in FIGS. 6A and 6B. It is estimated that the energy-harvesting device will weigh 3 (lbs) and supply an average power of 30 mW at 3 Volts for most of the Martian year. Thousands of energy-harvesting devices could be deployed on the surface of Mars to collect weather and biologically related data for several decades. The device utilizes eighteen thermoelectric modules as shown at 90 in FIG. 8. These are small modules with dimensions of 0.3 inch×0.3 inch×0.1 inch. Each module consists of two sets of couples connected in parallel. Each set of couples consists of 169 couples connected in series. So the total number of couples in each module is 338. The couples are connected at both of the module surfaces with gold tabs that are spot-welded. At a temperature difference between the module surfaces and a matched load, the voltage produced by each of the modules is about 10 volts. The minimum useful voltage is about 1 volt that would be produced by a temperature difference of 2 degrees C. Twice per day, when the temperature difference is transitioning between plus 2 degrees and minus 2 degrees, the diodes will leak a small amount of current. Thus, in some embodiments a switch may be provided to isolate the capacitor during these low temperature-difference periods. The reader should note that additional modules could be added which would permit the unit to squeeze useful power out of these very small temperature differences. For example, if we use 36 modules instead of 18 and increase the length of the modules to 0.2 inch, we can obtain useful power at temperature differences down to 1 degree C. and increase the operating time of the unit from about 79 percent of each cycle to about 89.5 percent.

The energy-harvesting generator temperature is maintained at the daily average atmospheric temperature on Mars that is dependent on its location on Mars. The generator absorbs heat from the warm atmosphere during the day and expels heat to the atmosphere at night. This heat passes through a thermoelectric module and a fraction of the heat is converted into electrical power. The minimal wind speed of about 2.5 m/s throughout the Mars year provides the means of absorption and expulsion of heat to and from the generator's heat exchanger fins.

Figure 7:
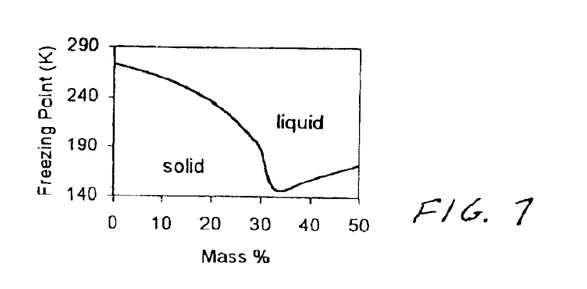
FIG. 7 show properties of a preferred phase change material.

A phase change substance such as a water-ammonia solution would work well on Mars because it has a high heat of fusion and wide variability in freezing temperature as indicated in FIG. 7. By choosing the appropriate ammonia to water mass fraction, the melting point of the solution could be adjusted to match the average daily temperature on Mars. This temperature would depend on the latitude (and somewhat on longitude) of the generator on Mars.

During the Mars night the water-ammonia solution freezes and during the Mars day it melts. The energy-harvesting generator has only enough solution so that a full night of generator cooling is required to freeze all of the solution and a full day of generator heating is needed to melt all of the solution. More solution than this would result in the addition of unnecessary generator weight. Less solution would result in the generator prematurely changing temperature before the day and nights end, which would result in a rapid reduction in temperature difference across the generator, thus less output power.

Module efficiency is more important than module power in the design of this generator because the weight of the heat storage solution (water-ammonia) must be reasonably low to reduce launch cost. (For application on earth, this is probably not a consideration. Thus, high module efficiency results in less heat storage solution required for a given amount of electrical energy. For a given fin design and fixed small temperature difference, the maximum module power output can be achieved if the module thermal resistance is equivalent to the thermal resistance of the fin unit. This is the optimal solution from the heat-flow-times-efficiency product for the module. This results in an equal temperature difference across the module and heat exchanger. However because generator mass is a concern for the Mars application, the unit may preferably be designed for a greater delta T across the module to increase the module efficiency at the cost of reduced electrical power. The highest module efficiency can be achieved if the delta T across the fins is nearly zero. However, this would require that the heat exchanger be very large. Thus volume becomes a problem.

Power Estimate

Applicants estimate that the energy-harvesting generator will produce 30 mW of power at 3 volts for 65% of the Martian year. This estimate is based on the following properties and conditions listed in Table 1 below

TABLE 1

| Material Property or Condition | Value | Source |
|---|---|---|
| Generator location on Mars (° N, ° W) | 22, 48 | Tillman, 1994 |
| mean diurnal temperature (° K) | 210 | Tillman, 1994 |
| diurnal temperature variation (° K) | 40 | Tillman, 1994 |
| wind speed (m/s) | 2.5 | Tillman, 1994 |
| Atmospheric density (kg · m$^{-3}$) | 0.019 | Tillman, 1994 |
| Atmospheric kinematic viscosity (m$^2$ · s$^{-1}$) | 0.01 | Tillman, 1994 |
| Atmospheric pressure (mbar) | 7.2 | Seiff, 1976 |
| Thermal conductivity of $CO_2$ (mW · m$^{-1}$ · K$^{-1}$) | 9.6 | HC&P, 2001 |
| heat exchanger cross flow area (m$^2$) | 0.22 | selected for design |
| heat exchanger efficiency (%) | 75 | estimated |
| thermoelectric module efficiency range (%) | 0–0.78 | Marlow Ind., Inc. |
| water-ammonia freezing point (° K) | 210 | Perry, 1950 |
| water-ammonia heat of fusion (KJ · kg$^{-1}$) | 333 | HC&P, 2001 |

For 35% of the year the generator will provide only a couple milliwatts of electrical power. The generator will automatically shut down during this period, hence the generator would probably be best suited for low-cost, long-term missions in which continuous operation is not required and low temperature electronics are available. There may be other designs or materials that can limit this non-operational period.

The energy-harvesting generator could be deployed to various locations on the surface of Mars using an airbag landing system. Such a system was successfully demonstrated in NASA's deployment of the 2,000-pound lander during the Mars Pathfinder mission in 1976. The airbags used were 71 inches in diameter and made of high strength fiber called Vectran as indicated in FIG. 4. One air-bag encapsulating the 3 pounds harvesting generator (see FIG. 8) should provide more than enough impact protection. The generator would have about 2½ feet of cussion or flex distance on all sides of the airbag. The small size and weight of the proposed energy-harvesting generator would make large scale climate monitoring networks on Mars low-cost, safe, and long-term.

Quantum Well Thermoelectric Modules

The embodiments described uses conventional thermoelectric modules that have been available for many years. These modules are extremely reliable, many providing power for decades in space applications. Therefore, as of today they are the natural choice for a Mars application. However, for future application or applications requiring very high efficiency a better choice may be quantum well thermoelectric modules. Some of these modules are described in the following sections.

Applicants Earlier Patents

On Aug. 1, 2000 Applicants were granted U.S. Pat. Nos. 6,096,964 and 6,096,965 both of which have been incorporated herein by reference. In these patents Applicants disclose techniques for placing the thin alternating layers on film substrates to produce quantum well thermoelectric modules. In these patents the alternating layers specifically described include layers comprised of silicon and silicon-germanium. The silicon is referred to as barrier layers and the SiGe layers are referred to as conducting layers and are appropriately doped to produce n legs and p legs.

An n-doping atom is typically the atom having one more electron than the base semiconductor atoms. The extra atom provides a conducting electron supporting current flow. A p-doping atom is typically the atom having one fewer electron than the base semiconductor atoms. The missing electron becomes an electron acceptor location (i.e., a hole) supporting current flow. As explained in the Dohler article, in these very thin layers electrons made available for conduction in the n-doped conduction layer can migrate to the boundary layer to make conduction possible there. Applicants believed that the excellent conducting properties of these materials are due to the fact that conduction can take place through the boundary layer crystals without being impeded by ions in the crystals which produce electrostatic fields which impede the flow of electrons. The same reasoning applies to the p-doped layers. In this case excess electrons migrate from the boundary layers to the p-doped conduction layers to produce holes in the boundary layers without current impeding ions. Thus, resistance to current flow is enormously reduced. Some materials possess thermoelectric properties without doping. In the '387 patent Applicants disclose that the layers of boron-carbide would make very good thermoelectric material especially for the p-type legs. GeTe and PbTe were also proposed as possible materials for the T/E elements.

Although the SiGe/Si superlatice material performs very well at low and moderate temperatures, performance above about 250 C is not much better than bulk SiGe alloys. Applicants' boron carbide quantum wells perform very well at low temperature and high temperatures as p-legs and but do not perform well as n-legs. It is for this reason that Applicants investigated and subsequently discovered the very good thermoelectric properties of Si/SiC material. A preferred embodiment of the present invention provides p-legs and n-legs that perform very well at high temperatures with an expectation that thermoelectric modules using these two legs will have module efficiencies of about 30% to 40%.

Applicants' Experiments

Applicants experiments have shown extraordinary promise for thermoelectric couples based on multilayer B4C/B9C films. The power delivered into a matched load, at the level of a fraction of a microwatt, appears small, but is produced from a very small amount of active material. The efficiency calculated for each couple depends on the value taken for the thermal conductivity. If we assume no enhancement of the thermal conductivity, i.e. take the value for bulk $B_4C/B_9C$, the efficiency is about 4% for the lower temperature (90 degree C.) heat source and 10–11% for the 250° C. heat source. These figures are already a significant improvement over bismuth telluride and improve with the low thermal conductivity measurements of UCLA as discussed below. The power factor numbers ($\alpha^2/\rho$) indicate that there is some quantum well confinement in the $B_4C/B_9C$. The Applicants' data have been confirmed by similar measurements at the Naval Research Laboratory.

The Seebeck coefficient does not change with the relative thickness of the Si substrate since this parameter is independent of thickness. However, as the Si substrate thickness is reduced, the ratio of the film resistance to the substrate resistance is increasing. Since the resistance of the film is so much lower than the Si substrate, the composite resistivity will drop as the substrate thickness decreases.

Si/sic

Recent test results by Applicants indicate that Si/SiC multi-layer films exhibit very favorable Seebeck coefficient ($\alpha$), resistivity ($\rho$) (see Table I) and power factor ($\alpha^2/\rho$) values as shown in Table I. If their thermal conductivity values are low over the full operating temperature range, as expected for quantum well materials, the thermoelectric figure-of-merit should be close to that of $B_4C/B_9C$. Further, the power factor values are expected to increase with increasing temperature due to a decrease in resistivity and an increase in Seebeck coefficient. Si/SiC multilayer films are therefore highly promising for n-leg application, offering prospects of both a high thermoelectric figure-of-merit and a high operating temperature, based on the refractory nature of silicon carbide. The Applicants are convinced that $B_4C/B_9C$—Si/SiC QW couples will exhibit module efficiencies much improved over prior art couples. They project module efficiencies of 30% to 40%, is a giant step in thermoelectric development.

Figure 5:
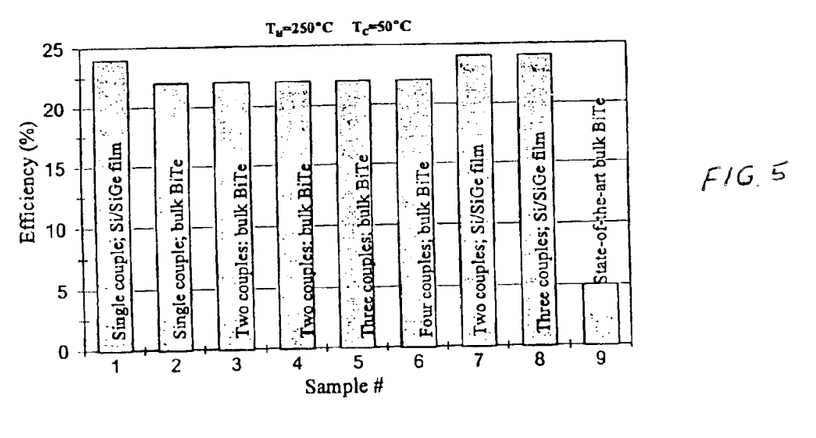
FIG. 5 shows Applicant's calculated efficiencies for several thermoelectric samples.

Recent measurements at UCLA indicate that the thermal conductivity of the B4C/B9C multi-layer films is significantly reduced in comparison with the bulk value. The use of the UCLA low value for the in-plane thermal conductivity leads to a factor of 3 enhancement in the performance (i.e., figure of merit) of the material. The data based on the assumption of the UCLA thermal conductivity value are also included in Table 1 and FIG. 5 and show the promise of this technology. Measurements at UCLA on multi-layer QW films of Si/SiGe also showed a reduction in thermal conductivity by about a factor 3 in comparison with bulk material. The measurement to date has been made only at room temperature.

Applicants' Demonstration Projects

Applicants have successfully produced Si/SiC multi-layer quantum well films. Magnetron sputtering was used to deposit films of SiC with Si as the barrier material, on silicon substrates. Films of individual layer thickness about 100 A, and up to 10,000A in total thickness, were deposited. Applicants believe that this is the first time that multi-layer films of Si/SiC have been successfully deposited. Measurements on these materials indicated excellent resistivity and Seebeck coefficient values. Table 1 shows the thermoelectric properties of these films at room and higher temperatures. These numbers confirm the promise of this material combination, resulting from QW confinement of the carriers. Based on thermal conductivity measurements of Si/SiGe and $B_4C/B_9C$ films, which have a factor of 3–4 reduction versus bulk alloys, these multi-layer QW Si/SiC films are expected on theoretical grounds to show similar reductions in thermal conductivity. These experiments show that Si/SiC is a preferred choice for the n-leg of a highly efficient thermoelectric power conversion device.

TABLE I

| Temperature (° C.) | Resistivity (mΩ-cm) | Seeback Coefficient ($\mu$V/° C.) |
| --- | --- | --- |
| 25 | 2.15 | −750 |
| 250 | 1.71 | −1080 |
| 500 | 1.52 | −1240 |

Film deposition was performed using a Veeco magnetron sputtering unit at Hi-Z, with 3-inch targets, and by side-sputtering using 2 or 3 inch targets at the University of California, San Diego (UCSD). Techniques were developed to control and measure the thickness of each layer, with a typical target of 100A per layer, deposited in about 1 minute. Deposition normally occurred on a [100] silicon wafer 3 inches in diameter.

Some non-uniformity was noted around the edges of the wafer, so samples for measurement were taken from the central area. In the case of the B4C/B9C multi-layer films, annealing was performed prior to measurement.

$B_4C/B_9C$ and Si/SiC Superlattice Module

In this embodiment thermoelectric elements are made with p-type legs comprised of superlattices of alternating layers of $B_4C$ and $B_9C$ and n-type legs comprised of a superlattices of alternating layers of Si and SiC. Both $B_4C$ (as a p-leg) and SiC (as an n-leg) function as thermoelectric elements without added doping.

Making Thermoelectric Elements $B_4C/B_9C$ p-Legs and SiC/Si n-Legs

Figure 2A:
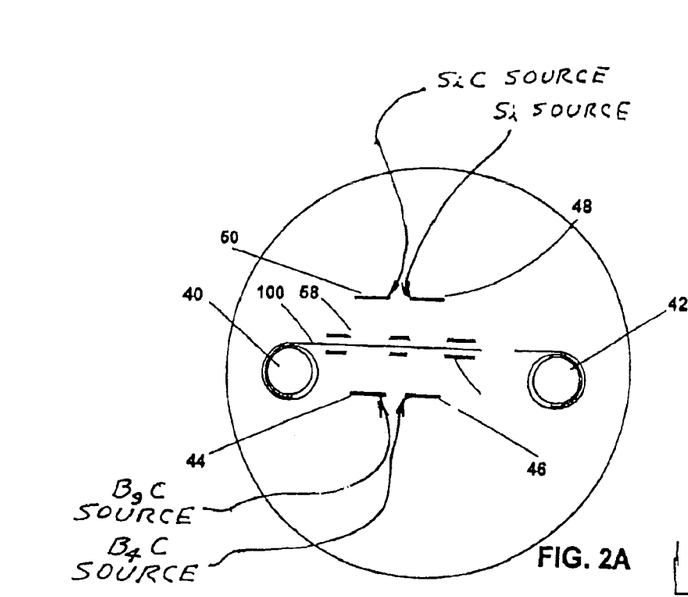
FIG. 2A is a top view of a preferred deposition chamber for fabricating thermoelectric film.
Figure 2B:
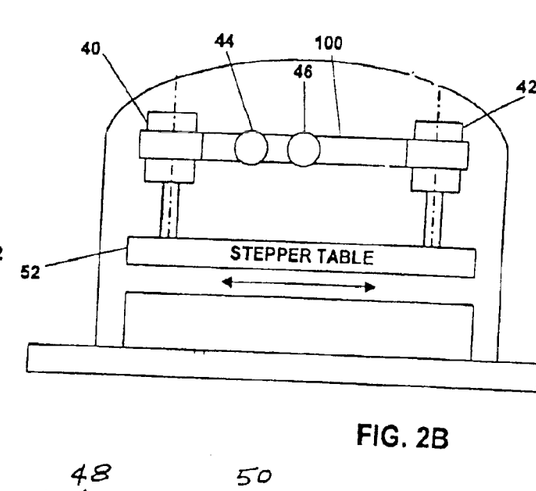
FIG. 2B is a side view of a preferred deposition chamber for fabricating thermoelectric film.
Figure 3:
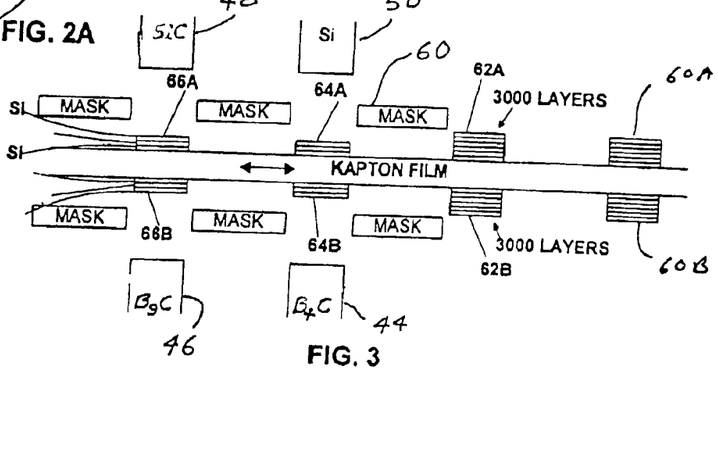
FIG. 3 shows an enlarged view of a section of Kapton® tape with alternating layers attached.
Figure 4A:
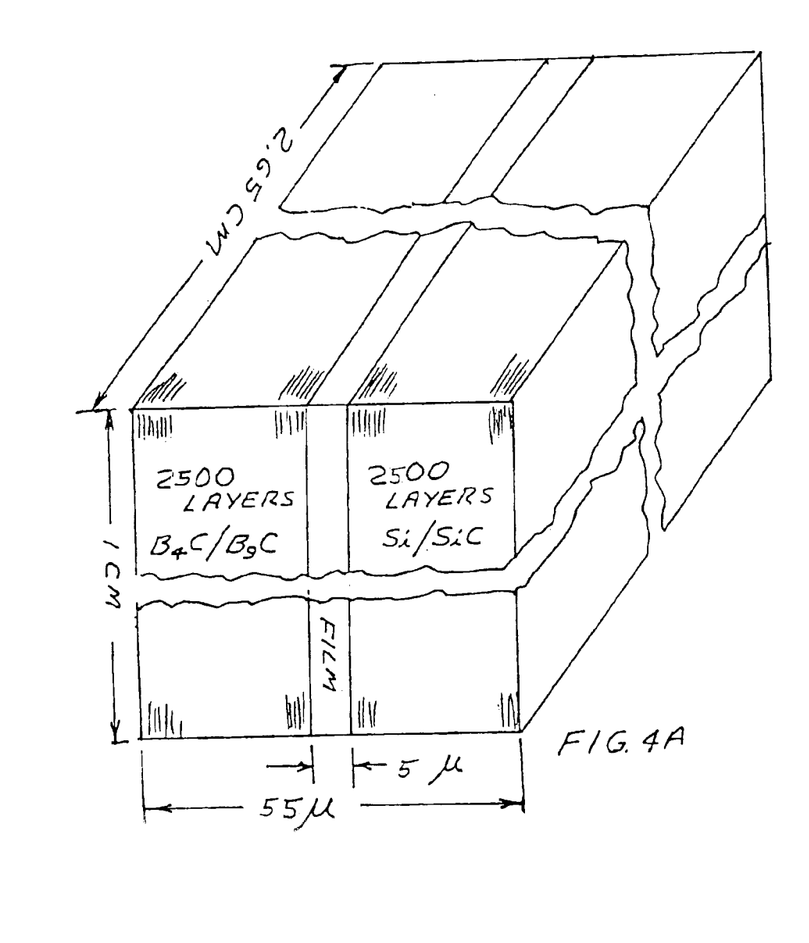
FIGS. 4A and 4B are views of a preferred thermoelectric couple.
Figure 4B:
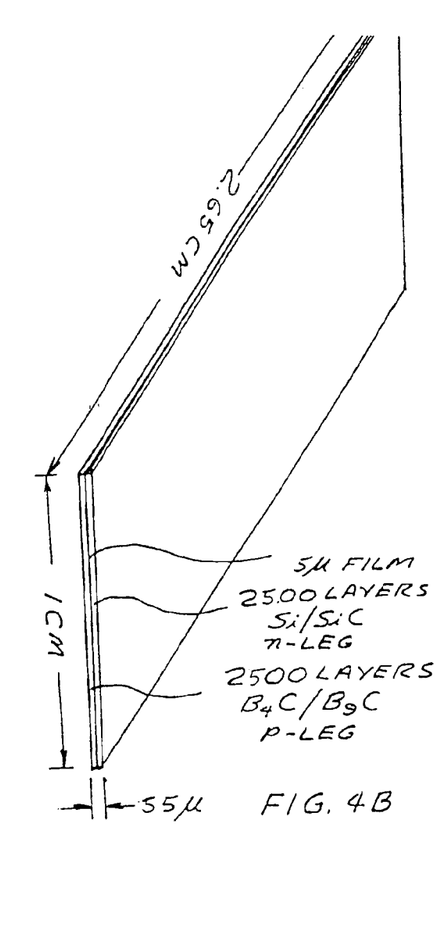

Preferred techniques for preparation of thermoelectric film can be explained by reference to FIGS. 2A through 4I. FIG. 2A is a top view of a preferred deposition chamber for fabricating thermoelectric film. FIG. 2B is a side view sketch. A roll 40 of plain Kapton® film coated on both sides with a 0.1 micron thick layer of crystalline Si feeds take-up roll 42. The coated film is about 2.5 microns thick. Alternate layers (10 nm thick) of $B_4C$ (as the "conducting" layers) and $B_9C$ (as the "insulating" layers) are deposited on one side of the tape from sources 44 and 46 and alternate layers of SiC (for the "conducting" layers) and Si (as the "insulating" layers) are deposited on the other side from sources 48 and 50. Stepper table 52 steps the tape back and forth so that 2500 layers of Si/SiC and 2500 layers of $B_4C/B_9C$ are deposited to form each thermoelectric element. FIGS. 4A and 4B show the dimensions of each thermoelectric element comprising one p-leg and one n-leg. The element has 2500 alternating layers of $B_4C/B_9C$ (1250 layers of each) for the p-leg and 2500 layers of Si/SiC (1250 layers of each) for the n-leg, each leg being separated by one layer of silicon film about 5 microns thick. Each of the 5000 layers are about 10 nm thick.

Figure 4C:
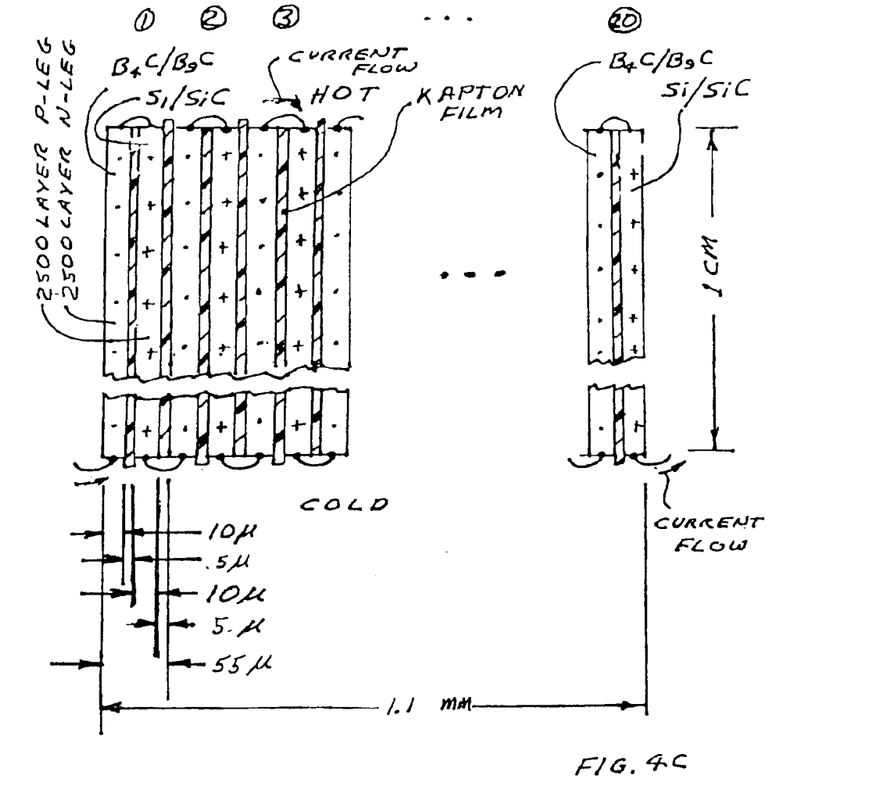
FIG. 4C shows a 20-couple thermoelectric set connected in series.

The alternating layers are 1 cm long and 2.65 cm wide so the completed element has the shape and size shown in FIG. 4B; i.e., 1 cm×2.65 cm×25 microns thick. Twenty of these elements are joined together with silicon film as shown in FIG. 4C to form a 20 couple thermoelectric set. The elements are connected in series as shown in FIG. 4C with a copper bond that may be made using a vapor deposition process. Note that the silicon insulating layers are allowed to extend beyond the thermoelectric material where the legs are not to be connected so the copper deposit can be uniformly applied then lapped until the separating insulator layers are exposed. Each of the couples (one n-leg and one p-leg) will generate about 2 mV/degree C. So with a 300 degree C. temperature difference, the 20-element set will create a potential of about 12 Volts.

Figure 4D:
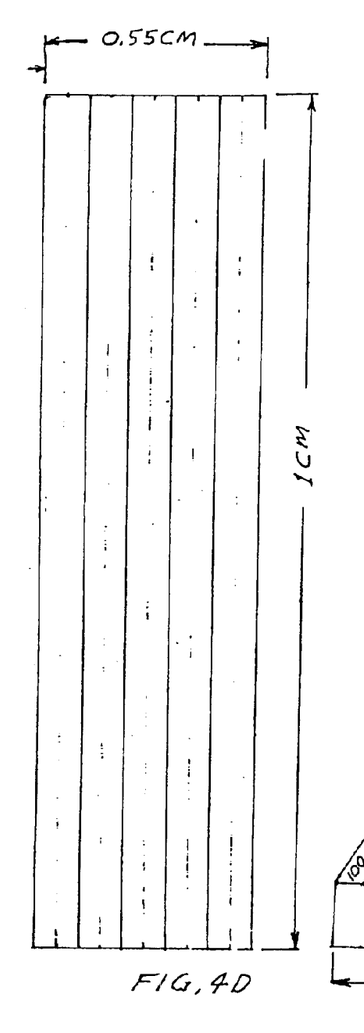
FIGS. 4D and 4E are views of a 100-couple thermoelectric set.
Figure 4E:
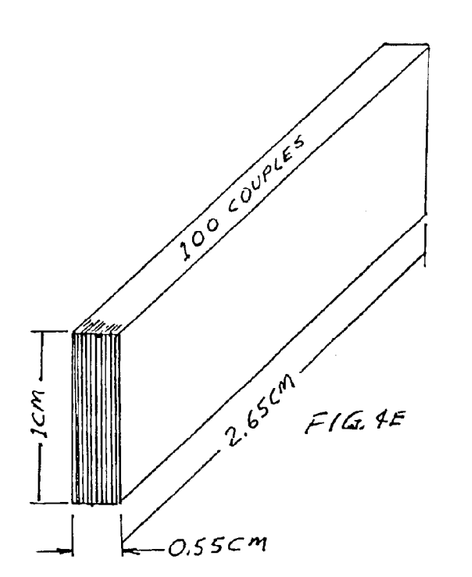

Five of these twenty couple thermoelectric sets are joined together as shown in FIG. 4D to form a 100 couple thermoelectric set but the five sets are connected in parallel so that the potential produced is still 12 Volts. This 100-element set is shown in prospective in FIG. 4E. The dimensions of this set are 1.0 cm×2.65 cm×0.25 cm.

Figure 4F:
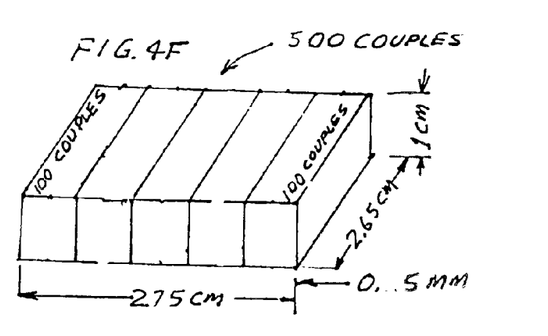
FIG. 4F is a sketch showing dimensions of a 1000 couple thermoelectric module.
Figure 4G:
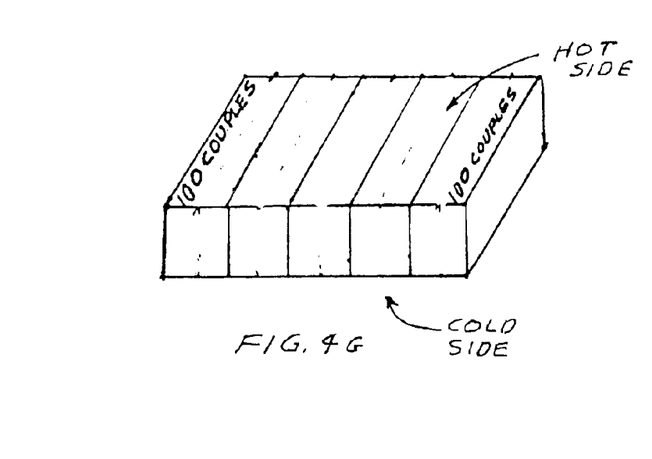
FIG. 4G is another view of the FIG. 4F module.
Figure 4H:
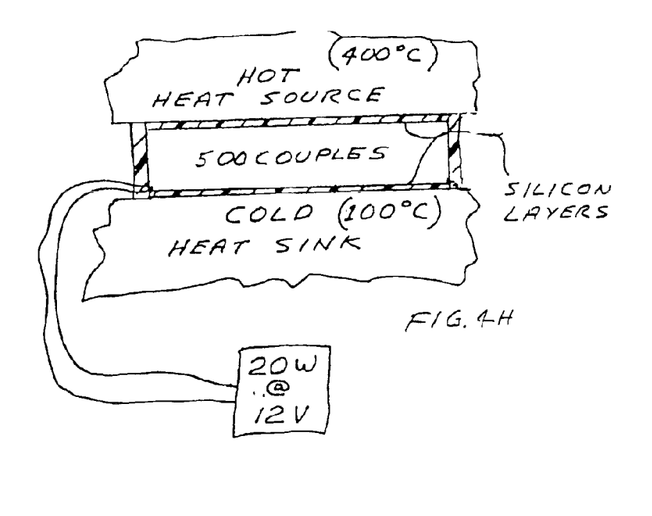
FIG. 4H shows the module in use.
Figure 4I:
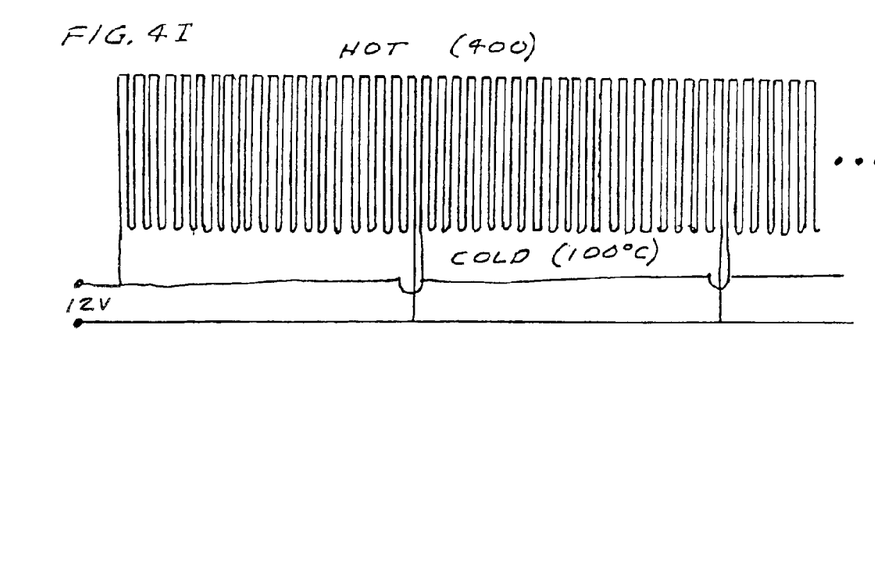
FIG. 4I shows how the legs of the module are connected electrically.

Finally five of these 100-element sets are joined to form a 500-couple thermoelectric module as shown in FIG. 4F which has the dimensions 2.65 cm×2.75 cm×1 cm. This module is mounted as shown in FIGS. 4G and 4H with each of the two 7 $cm^2$ sides positioned tightly against a hot heat source at 400 degrees C. and a cold heat sink at 100 degrees C. Again, the 100 element sets are connected in parallel so the voltage generated remains at about 12 Volts. The electrical connections are as shown in FIG. 4I.

Substrates

Substrates for Superlattice Thermoelectric Material

As described in United States Patents '467, '387, '964 and '965, quantum well thermoelectric material is preferably deposited in layers on substrates. For a typical substrate as described in those patents, heat loss through the substrate can greatly reduce the efficiency of a thermoelectric device made from the material. If the substrate is removed some of the thermoelectric layers could be damaged and even if not damaged the process of removal of the substrate could significantly increase the cost of fabrication of the devices. The present invention provides a substrate that can be retained. The substrate preferably should be very thin, a very good thermal and electrical insulator with good thermal stability and strong and flexible.

Silicon

Silicon is the preferred substrate material for depositing the Si/SiGe and $B_4C/B_9C$ layers. Si has also been used by Applicants as a substrate for depositing Si/SiGe alloys. Si is available commercially in films as thin as 5 microns from suppliers such as Virginia Simiconductor with offices in Fredricksburg, Va. By using a 5 micron substrate the amount of bypass heat loss can be held to a minimum. For commercial applications the quantum well film will be approximately 25 microns thick as explained above. Thus the ratio of quantum well thickness to substrate thickness is more than sufficient to greatly minimize by-pass heat losses. Si is also preferred because its 110 atomic orientation is well suited for the thermoelectric materials. The silicon film is stable at much higher temperatures than Kapton.

Kapton®

Kapton is a product of DuPont Corporation. According to DuPont bulletins:

Kapton® polyimide film possesses a unique combination of properties that make it ideal for a variety of applications in many different industries. The ability of Kapton® to maintained its excellent physical, electrical, and mechanical properties over a wide temperature range has opened new design and application areas to plastic films.

Kapton® is synthesized by polymerizing an aromatic dianhydride and an aromatic diamine. It has excellent chemical resistance; there are no known organic solvents for the film. Kapton® does not melt or burn as it has the highest UL-94 flammability rating: V-0. The outstanding properties of Kapton® permit it to be used at both high and low temperature extremes where other organic polymeric materials would not be functional.

Adhesives are available for bonding Kapton® to itself and to metals, various paper types, and other films.

Kapton® polyimide film can be used in a variety of electrical and electronic insulation applications: wire and cable tapes, formed coil insulation, substrates for flexible printed circuits, motor slot liners, magnet wired insulation, transformer and capacitor insulation, magnetic and pressure-sensitive tapes, and tubing. Many of these applications are based on the excellent balance of electrical, thermal, mechanical, physical, and chemical properties of Kapton® over a wide range of temperatures. It is this combination of useful properties at temperature extremes that makes Kapton® a unique industrial material.

Kapton® Substrate

Applicants have demonstrated that Kapton can be useful as a substrate film for superlattice thermoelectric layers when high temperature use is not planned. Applicants have shown that a crystal layer laid down between the Kapton® substrate and the series of very thin conducting and barrier layers greatly improve thermoelectric performance especially for n-type layers. The preferred technique is to lay it on about 1000 Å thick in an amorphous form then to crystallize it by heating the substrate and the silicon layer to about 350° C. to 375° C. The crystalline layer should have the same crystalline structure as the layers.

Other Substrates

Many other organic materials such as Mylar, polyethylene, and polyamide, polyamide-imides and polyimide compounds could be used as substrates. Other potential substrate materials are oxide films such as $SiO_2$, $Al_2O_3$ and $TiO_2$. Mica could also be used for substrate. As stated above, the substrate preferably should be very thin a very good thermal and electrical insulator with good thermal stability, strong and flexible.

Other Lattice Materials

Many other thermoelectric materials may be used as p-legs along with Si/SiC n-legs. Superlattice materials are preferred. Measurements of thermal conductivity normally show a threefold reduction in QW.films compared with bulk materials, as reported below. Applicants have found that Si/SiGe multi-layer films performed well at room temperature and below, but their performance at temperatures in the range of 250 degrees C. fell to that of bulk bismuth telluride.

Thin Film Thermoelectric Legs

Figure 10A:
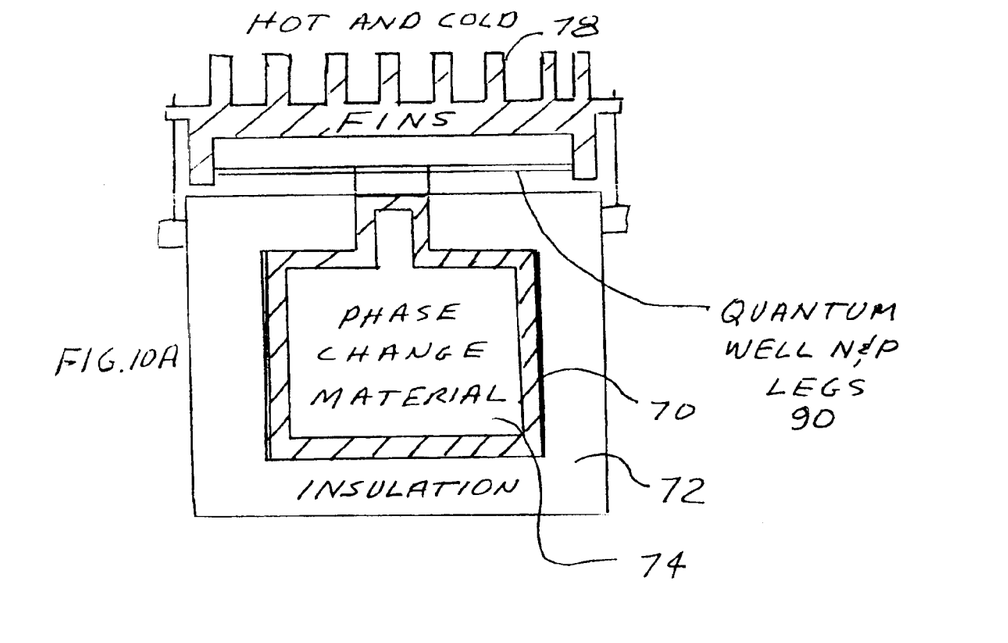
FIGS. 10A and 10B shows a preferred embodiment of the present invention that utilizes quantum well thermoelectric material.
Figure 10B:
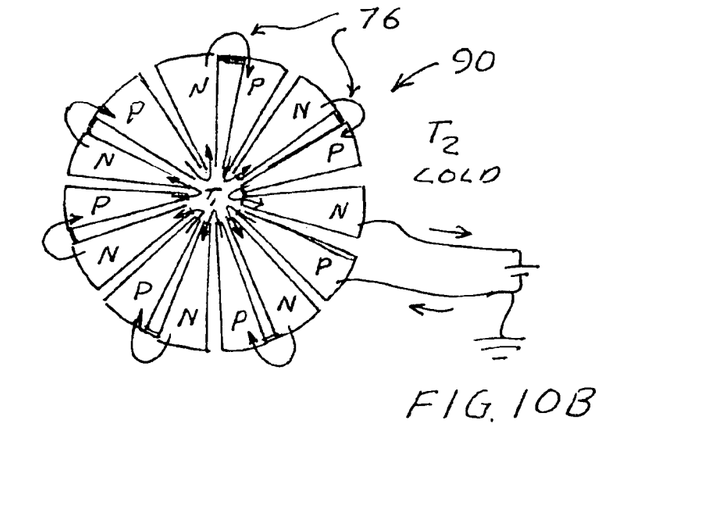

FIGS. 10A and 10B show a technique for utilizing thin films of quantum well layers as p-legs and n-legs in a module without stacking the legs as shown in FIGS. 4A, 4B and 4C. In this case current flow is radial through the n-legs N and the p-legs P 90 as shown in FIGS. 10A and 10B. Phase change material 74 in container 70 provides a constant temperature while fins 78 alternate in temperature above and below the phase change temperature. The arrows 76 in FIG. 10B show the direction of current flow when the fin temperature, $T_2$ is colder than the phase change temperature T1.

Other Applications Where Energy is Harvested from the Environment

In addition to space applications the present invention has many potential applications on earth. For example, it can be used for harvesting environmental energy for weather stations in remote locations for measuring environmental data such as wind speed, temperature, pressure, humidity and chemicals in the air and for transmitting the data environmental data. The unit could be deployed by aircraft in rugged or hazardous terrain and the unit could transmit the environmental data via satellites. The unit could operate for decades and could be abandoned after its useful life without concern of environmental pollution associated with batteries or radioactive heat sources.

While the above description contains many specificites, the reader should not construe these as limitations on the scope of the invention, but merely as exemplifications of preferred embodiments thereof. Those skilled in the art will envision many other possible variations within its scope. The thin layers of boron carbide and Si/SiC could be arranged in many other forms for various applications. It is not necessary that the layers be grown on film. For example, they could be grown on thicker substrates that are later removed. There are many other ways to make the connections between the legs other than the methods discussed. Accordingly, the reader is requested to determine the scope of the invention by the appended claims and their legal equivalents, and not by the examples which have been given.

We claim:

1. An electric generator for generating electric power from a medium experiencing a cycling temperature defining hotter portions and a colder portions of said cycling temperature, said generator comprising:

A) a container containing a phase change material,
   B) a heat transfer element in thermal communication with said medium experiencing said cycling temperature,
   C) a thermoelectric module sandwiched between said container and said heat transfer element,
   D) an electric energy storage device, and
   E) a bridge circuit for utilizing electric power generated by said thermoelectric module to charge said electric energy storage device during both of said hot and cold portions of said temperature cycles.

2. The generator as in claim 1 wherein said phase change material comprises ice and water.

3. The generator as in claim 1 wherein said phase change material comprises water and ammonia.

4. The generator as in claim 1 wherein said phase change material is at a temperature approximately equal to its solid-liquid phase change temperature.

5. The generator as in claim 1 wherein said phase change material is at a temperature approximately equal to its liquid-vapor phase change temperature.

6. The generator as in claim 1 wherein said heat transfer element is a finned element.

7. The generator as in claim 1 wherein said generator comprises at least one thermoelectric module comprised of thin film thermoelectric n-legs and p-legs.

8. The generator as in claim 1 wherein said generator comprises:
   A) a plurality of n-legs comprised of very thin alternating layers of silicon and silicon carbide; and
   B) a plurality of p-legs;
   said p-legs and said n-legs being electrically connected to produce said thermoelectric module.

9. A thermoelectric module as in claim 8 wherein said p-legs comprise very thin alternating layers of boron carbide.

10. A thermoelectric module as in claim 9 wherein said very thin alternating layers of boron carbide comprise two different stoichiometric forms of boron carbide.

11. A thermoelectric module as in claim 3 wherein said very thin alternating layers of boron carbide are alternating layers of $B_4C$ and $B_9C$.

12. A thermoelectric module as in claim 9, wherein said plurality of n-legs is comprised of a plurality of very thin alternating layers of silicon and silicon-carbide and said very thin alternating layers of boron carbide are alternating layers of $B_4C$ and $B_9C$.

13. A thermoelectric module as in claim 8 wherein said alternating layers are deposited on a substrate.

14. A thermoelectric module as in claim 13 wherein said substrate is silicon.

15. A thermoelectric module as in claim 13 wherein said substrate is silicon film.

16. A thermoelectric module as in claim 15 wherein said substrate is a polyimide substrate.

17. A thermoelectric element as in claim 16, wherein said polyimide substrate is Kapton®.

18. A thermoelectric element as in claim 17, wherein said polyimide substrate is Kapton® film.

19. A thermoelectric element as in claim 8, wherein said very thin alternating layers are each less than 100 nm thick.

20. A thermoelectric element as in claim 8 wherein said very thin alternating layers are each about 10 nm thick.

21. A thermoelectric element as in claim 8 wherein said plurality of very thin alternating layers is at least 1250 layers.

22. An electric generator for generating electric power from a medium experiencing a cycling temperature defining hotter portions and a colder portions of said cycling temperature, said generator comprising:
   A) a container containing a heat sink—heat source material,
   B) a heat transfer element in thermal communication with said medium experiencing said cycling temperature,
   C) a thermoelectric module sandwiched between said container and said heat transfer element.

23. A thermoelectric element as in claim 22 and also comprising an electric energy storage device for storing electric energy generated by said module.

24. A thermoelectric module as in claim 23 and also comprising a bridge circuit for utilizing electric power generated by said thermoelectric module to charge said electric energy storage device during both of said hot and cold portions of said temperature cycles.

* * * * *